United States Patent [19]

Kitahara et al.

[11] Patent Number: 5,266,849
[45] Date of Patent: Nov. 30, 1993

[54] TRI STATE BUFFER CIRCUIT FOR DUAL POWER SYSTEM

[75] Inventors: Takeshi Kitahara, Santa Clara; Robert K. Montoye, Los Gatos, both of Calif.

[73] Assignee: HaL Computer Systems, Inc., Campbell, Calif.

[21] Appl. No.: 839,480

[22] Filed: Feb. 19, 1992

[51] Int. Cl.5 ............... H03K 19/0175; H03K 19/00
[52] U.S. Cl. .................................... 307/475; 307/473; 307/296.2; 307/443
[58] Field of Search ............ 307/473, 475, 296.2, 307/443, 451

[56] References Cited

U.S. PATENT DOCUMENTS

| | | | |
|---|---|---|---|
| 4,612,461 | 9/1986 | Sood | 307/475 |
| 4,782,250 | 11/1988 | Adams et al. | 307/475 |
| 4,890,019 | 12/1989 | Hoyte et al. | 307/475 |
| 4,931,672 | 6/1990 | Khan | 307/475 |
| 5,017,811 | 5/1991 | Worley | 307/475 |
| 5,084,637 | 1/1992 | Gregor | 307/475 |
| 5,144,165 | 9/1992 | Dhong et al. | 307/296.2 |
| 5,153,457 | 10/1992 | Martin et al. | 307/475 |
| 5,159,216 | 10/1992 | Taylor et al. | 307/475 |

Primary Examiner—Edward P. Westin
Assistant Examiner—Andrew Sanders
Attorney, Agent, or Firm—A. C. Smith

[57] ABSTRACT

A CMOS tri-state buffer circuit transfers digital signals between a first digital circuit system operating at 3.3 Volts and a second system operating at 5 Volts. The buffer circuit receives an active high enable signal and a data signal as inputs to a tri-state select network. When the enable signal is high, data is propagated through a driver stage and onto a data bus in the second system. Driver clamp circuitry and an n-well voltage controller operate conjunction with the driver stage to prevent the 5 volt supply of the second system from interfering with the circuitry of the of the 3.3 Volt system. A clamped line driver transmits signals from the 5 Volt system to the 3.3 Volt system.

11 Claims, 4 Drawing Sheets

TRI STATE BUFFER CIRCUIT FOR DUAL POWER SYSTEM

BACKGROUND OF THE INVENTION

1. Field of the Invention

This invention relates to the design of electronic circuits and more particularly to a CMOS tri-state buffer which connects circuit components having different supply voltages.

2. Description of the Background Art

Recent improvements in semiconductor Complimentary Metal Oxide Semiconductor (CMOS) technology have resulted in extremely narrow channel transistor devices, having lengths of 0.5 $\mu$m and less. One advantage of these narrow devices is their ability to be densely packed on integrated circuits (IC's). As circuit designers have exploited this density feature, IC power consumption has increasingly become an important design issue, especially where the goal is to provide low power devices for portable digital equipment. One technique for lowering system power consumption has been to reduce IC power supply voltages from a typical 5 Volts (v), to voltages in the range of 3.0–3.3 V. CMOS IC's designed for use in these low voltage systems require thin gate-oxide transistors in order to maintain high overall device performance. This thin gate oxide limits voltage differences between gate and drain, between gate and source, and between gate and back gate, to limits lower than the voltage maximums of previous transistors which used thicker gate oxide.

The problem created by these thin gate oxide devices is that they are difficult to use in combination with the higher voltage devices in the same digital system, since the power supplies and device output swings employed in the older devices can easily damage the fragile oxide layers of the new high performance devices. A common approach to mixing thin and thick oxide technologies has been to mix the different devices on a single integrated circuit or chip using a special manufacturing process. This customized manufacturing process is expensive and is available for only a limited variety of device types. Since an objective of all commercial designs is to minimize manufacturing costs by using available components and processes where feasible, what is needed is a design for buffering these lower voltage devices in a system which may also use the more common 5V devices.

SUMMARY OF THE INVENTION

In accordance with the present invention, a circuit design is disclosed for a low power, high performance digital interface between electronic systems having differing power supply voltages. The buffer of the preferred embodiment connects an integrated circuit system powered by a 3.3 V supply to a signal bus operating between 0 and 5V. The buffer circuit is capable of both transmitting 3.3V digital signals and for receiving signals transmitted by a 5V system. The present buffer uses a feedback network to improve output frequency performance and to protect the buffer output device from excessive gate to drain voltages. A back-gate voltage control mechanism is also provided to prevent forward biasing of the diode formed between the p-material drain/source and the n-well of the p-channel output devices, when a 5V signal is present at the buffer output.

DESCRIPTION OF THE PREFERRED EMBODIMENT

Figure 1:
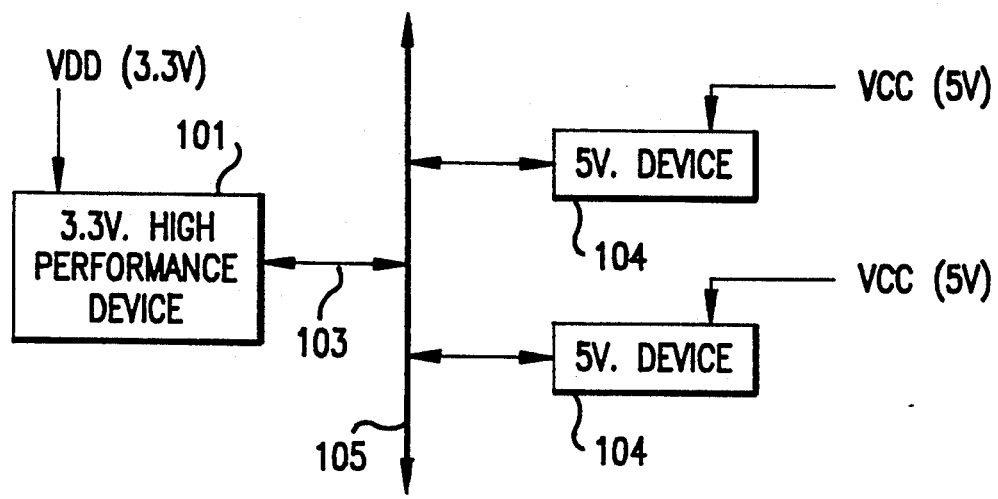
FIG. 1 is a block diagram showing the connection of a 3.3V high performance device containing the present invention, connected to a digital bus operating between 0 and 5V.

Referring now to FIG. 1, a block diagram is shown identifying the major components comprising a typical digital system in which the preferred embodiment of the present invention is employed. This typical system contains digital data bus 105 to which are attached a plurality of standard 5V devices 104. Also connected to data bus 105 are one or more high performance digital devices 101 utilizing high speed, low power 3.3V circuitry. Digital devices 101 are connected to data bus 105 through buffer bus 103.

Figure 2:
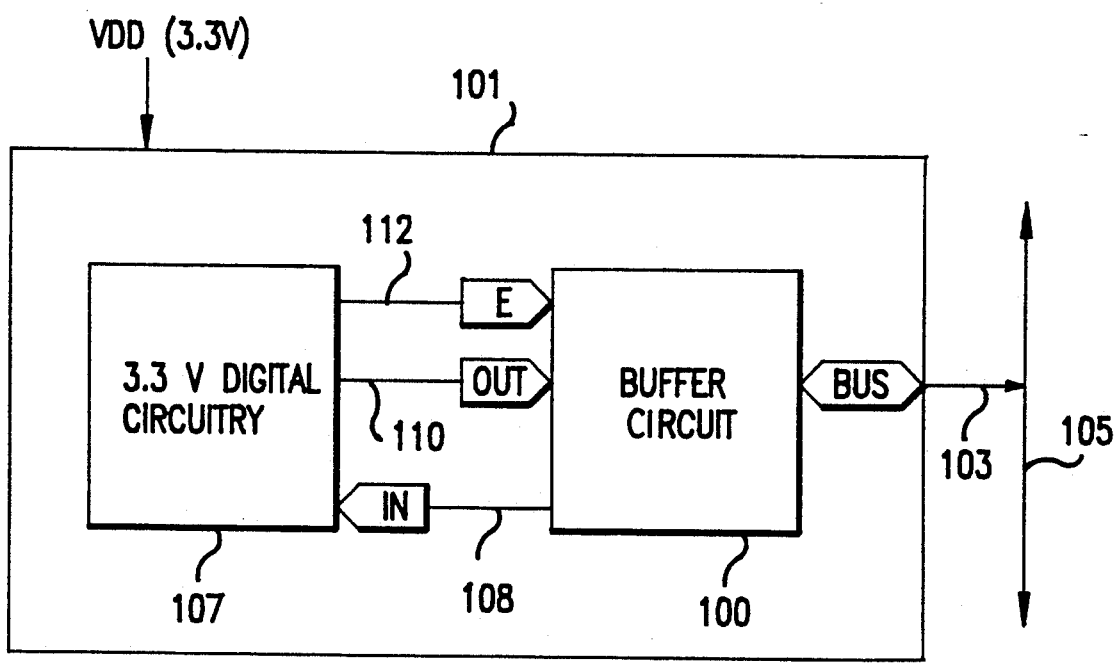
FIG. 2 is block diagram showing an overview of the 3.3V device of FIG. 1, including 3.3V digital circuitry and the buffer circuit of the present invention.

Referring now to FIG. 2, a block diagram details the architectural components of digital device 101. Device 101 contains 3.3V digital circuitry 107 connected to buffer circuit 100 through enable signal 112, output signal 110, and input signal 108. Buffer circuit 100 is capable of driving buffer bus 103 from 0 to approximately 3.3V, and is capable of receiving signals from buffer bus 103 ranging from 0 to 5V for converting such signals to input signal 108 in the 3.3V range. Enable signal 112 is an active high input, which when in the inactive low state, operates to drive the output of buffer circuit 100 to a high impedance mode.

Figure 3:
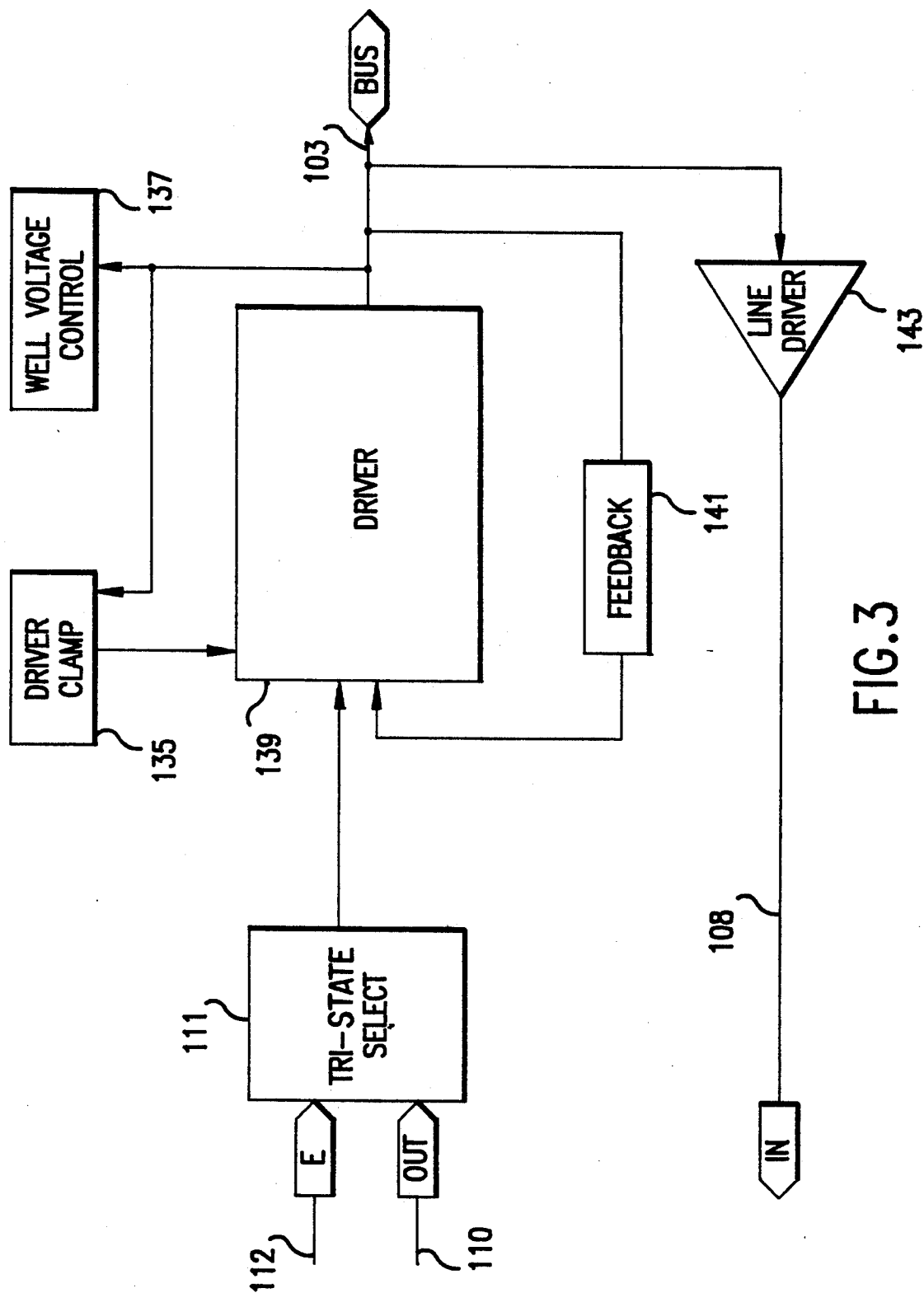
FIG. 3 is a generalized block diagram showing several features of the buffer circuit of the present invention.

Referring now to FIG. 3, a generalized or overview block diagram of one embodiment of the present invention illustrates the components of buffer circuit 100. This figure is illustrative of the circuit of the present invention generally that is illustrated in greater detail in FIG. 4 and FIG. 5. Tri-state select circuit 111 receives a pair of inputs including enable signal 112 and output signal 110 and transmits a data signal to driver circuit 139. When enable signal 112 is active high, driver circuit 139 propagates output signal 110 to buffer bus 103. Feedback network 141 propagates the buffer bus 103 signal back as input to driver circuit 139. Driver clamp circuit 135 and well voltage control circuit 137 also monitor buffer bus 103 for controlling driver circuit 139, and are described in detail below. Line driver 143 receives data from buffer bus 103, for generating input signal 108.

Figure 4:
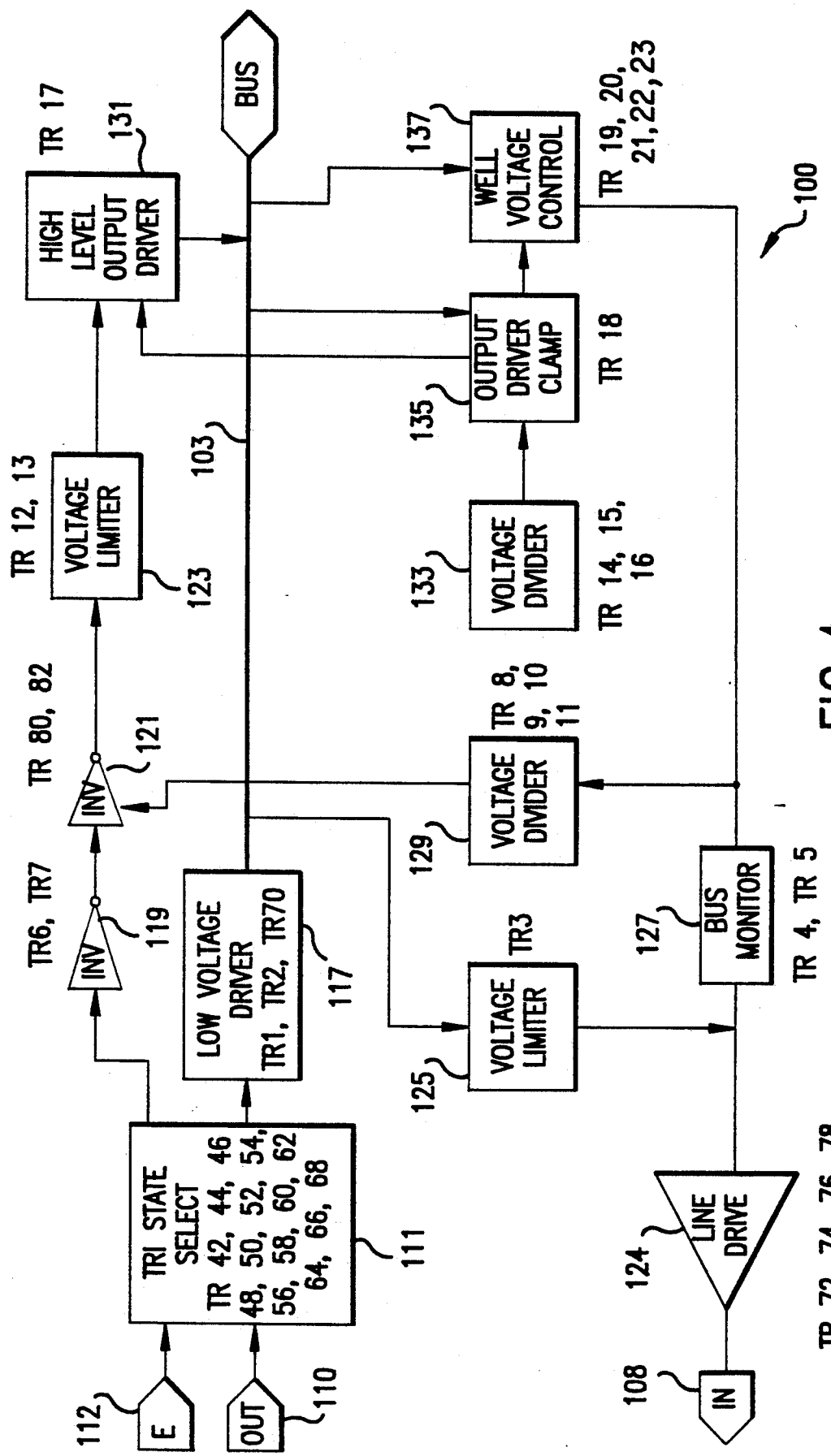
FIG. 4 is a block diagram showing the detailed signal flows of the buffer circuit of the present invention.

Referring to FIG. 4, a detailed block diagram is shown illustrating the signal flows in the operation of buffer circuit 100. For purposes of analyzing the operation of buffer circuit 100, the circuit can be viewed as operating in two separate modes: as a transmitter and separately as a receiver.

Transmitter Mode

In the transmitter mode, buffer circuit 100 transmits signals from digital circuitry 107 to data bus 105 (as illustrated in FIG. 2). Output signal 110 is transmitted into buffer circuit 100 and through tri-state select circuit 111, which works in conjunction with enable signal 112 to produce a high impedance at buffer bus 103 when enable signal 112 is low. "High," as it relates to ideal signal values in the 3.3V system of buffer circuit 100, is equal to $V_{DD}$ (3.3V) and "low" is zero volts. The actual values of high and low, as applied to this circuit, will deviate from the ideal voltage levels by one or more transistor drain to source voltage ($V_{DS}$) drops. This $V_{DS}$ drop is typically on the order of several tenths of a volt. When enable signal 112 is in a high state, output signal 110 from digital circuitry 107 is propagated through the tri-state select circuit 111 to low voltage driver circuit 117, where it is amplified and supplied to buffer bus 103.

In order to lower the output impedance of buffer circuit 100, and thereby drive buffer bus 103 with a higher voltage (closer to the $V_{DD}$ power supply level) and with greater current capacity, the present invention utilizes a high level output driver circuit 131 which includes a p-channel MOS transistor (Tr17) having a large aspect ratio (gate width to channel length). In order to mitigate frequency response degradation resulting from the large channel capacitance, a feedback network is used comprising bus monitor 127, voltage divider 129, voltage limiter 123, and high level output driver circuit 131. This feedback network 141 operates by continuously sampling the buffer bus 103 signal level through bus monitor 127, and using this sample signal to drive the gate voltage at output driver circuit 131. When buffer bus 103 is low, the gate voltage at output driver circuit 131 maintains a small amount of conductance through the output driver circuit 131 transistor. The delay associated with initiating current flow through the device when buffer bus 103 signal goes high is avoided, and thereby the frequency response of buffer circuit 100 is improved. This feedback network also prevents the gate-to-drain voltage of the output driver circuit 131 transistor (Tr17) from reaching a maximum level which could destroy the transistor gate oxide layer. In a typical MOS device this maximum voltage level is approximately 4V.

Receiving Mode

When buffer circuit 100 operates in the receiving mode, a 5V digital signal is transferred from data bus 105 to buffer bus 103. This mode is selected whenever enable signal 112 is low and tri-state select circuit 111 outputs a high impedance. The 5V signal is transmitted from buffer bus 103 through voltage limiter 125 to reduce the voltage range from 5V to the 3.3V power supply range of digital circuitry 107. This now limited 3.3V signal is then transmitted to digital circuitry 107 through line driver circuit 124 along input signal 108.

The use of differing power supply voltage levels between digital device 101 and data bus 105 presents particular difficulties for high level output driver circuit 131. The p-channel MOS transistor (Tr17) of output driver circuit 131 operates at a source voltage level of $V_{DD}$ (3.3V). If the transistor n-well is tied to the source, as is customary for p-channel operation, a 5V signal applied to the drain from the incoming signal from data bus 105 would cause the diode created by the drain and n-well junction of such a transistor to become forward biased, thereby resulting in a short circuit to the $V_{DD}$ power supply. In order to effectively operate the p-channel transistor in the high level output driver circuit 131, a well voltage control circuit is needed to keep the back-gate or n-well voltage at a level at least as high as the voltage of the incoming signal from buffer bus 103, as applied to the p-channel transistor of output driver circuit 131. The n-well voltage control circuit 137 then must allow the back-gate voltage of output driver circuit 131 to track the voltage on the buffer bus 103 when buffer circuit 100 is in the receive mode, and must set the back-gate voltage to $V_{DD}$ when buffer circuit 100 is operating in the transmit mode. Well voltage control circuit 137 serves the purpose of monitoring the voltage on the buffer bus 103 and maintaining the back-gate voltage of high level output driver circuit 131 at a level above $V_{DD}$ and equal to the voltage on data bus 103 when the incoming signal exceeds $V_{DD}$.

Another difficulty which occurs as a result of voltages on the buffer bus 103 in excess of $V_{DD}$, is the problem of transistor inversion. In order to turn output driver circuit 131 completely off during the receiving mode, the gate voltage is set equal to the source voltage of $V_{DD}$. However, when a drain voltage is applied to transistor (Tr17) of output driver circuit 131 which exceeds the source voltage, the transistor channel inverts and begins conducting from drain to source. Since a voltage differential exists between the drain and gate, the output impedance of such inverted transistor may precipitously drop, causing voltage levels along data bus 105 to drop to 3.3V. This problem is connected according to the present invention using driver clamp circuit 135 in conjunction with voltage divider 133. Driver clamp circuit 135 and voltage divider 133 operate to maintain the gate voltage on the transistor (Tr17) of the output driver circuit 131 at a level equal to the voltage on buffer bus 103, when the voltage on the buffer bus 103 exceeds $V_{DD}$.

Figure 5:
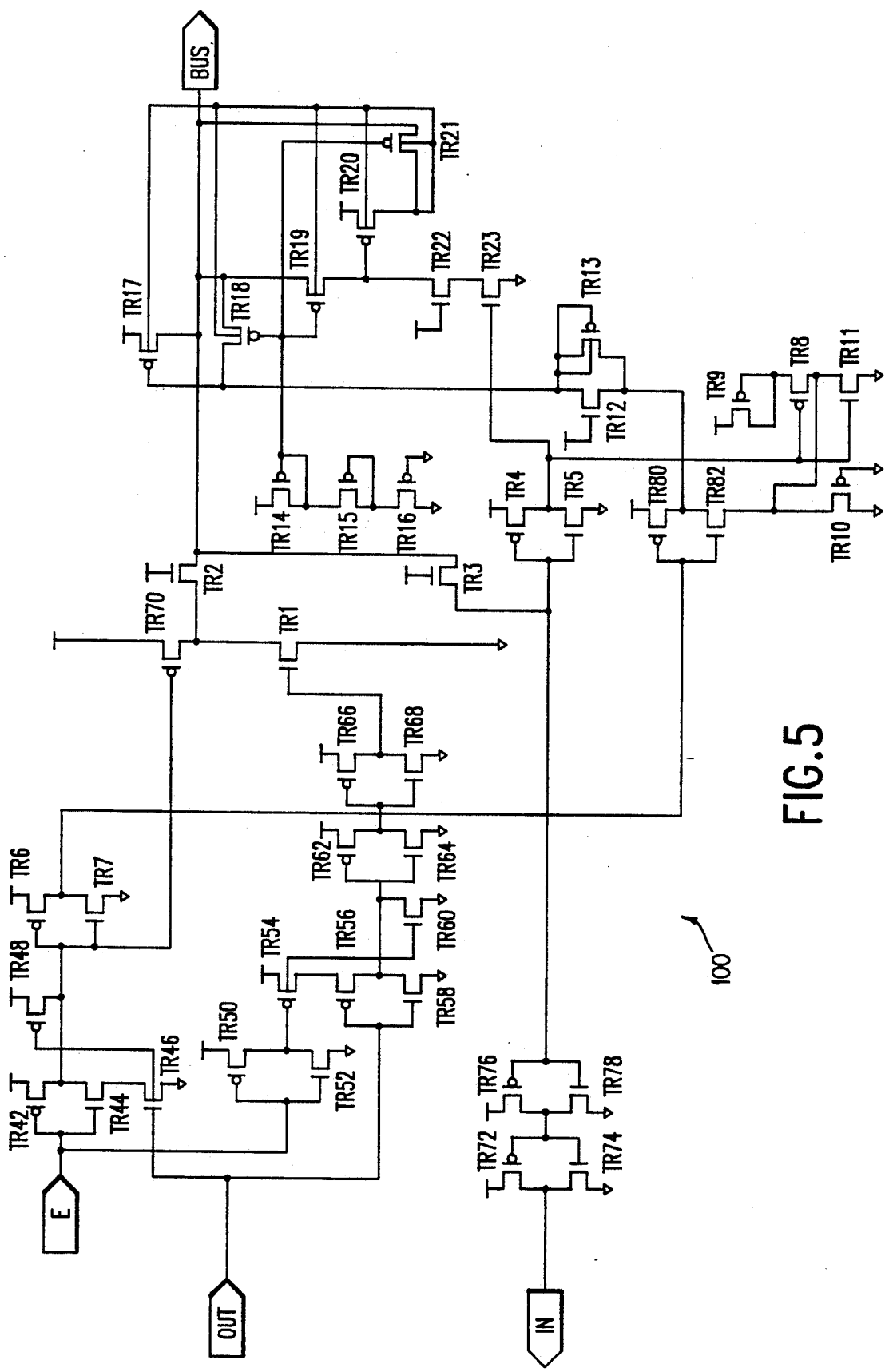
FIG. 5 is a circuit schematic of the buffer driver circuit of FIG. 3.

Referring now to FIG. 5, the detailed schematic diagram illustrates the transistor circuit comprising buffer circuit 100 according to one embodiment of the present invention. Tri-state select circuit 111 includes transistors Tr42, Tr44, Tr46, Tr48, Tr50, Tr52, Tr54, Tr56, Tr58, Tr60, Tr62, Tr64, Tr66, and Tr68. Transistors Tr42, Tr44, Tr46, and Tr48 combine to produce a NAND gate which drives the gate of Tr70 with output signal 110 when enable signal 112 is high. When enable signal 112 is low, the gate of Tr70 is driven high shutting off Tr70. Transistors Tr50, Tr52, Tr54, Tr56, Tr58, and Tr60 form a NAND gate to combine output signal 110 and the inverse of enable signal 112. Transistors Tr62, Tr64, Tr66, and Tr68 form a driver circuit 139 to the gate of Tr1 which serves as the compliment to Tr70 in forming low voltage driver circuit 117 that propagates output signal 110 when enable signal 112 is high. When enable signal 112 is low, both Tr70 and Tr1 are shut off, thereby presenting a high impedance to buffer bus 103. Transistor Tr2 serves as a voltage limiter by clamping all incoming signals from data bus 105 to $V_{DD}$ before the signals reach the complimentary drive transistors Tr70 and Tr1 of low voltage driver circuit 117. This voltage limiting by Tr2 protects against 5V signals leaking back through low voltage driver circuit 117 during operation of the buffer circuit 100 in the receiving mode.

Voltage limiter 125 includes transistor Tr3 which serves a function similar to that of Tr2 by clamping incoming signals to the voltage level of $V_{DD}$. Line driver circuit 124 includes transistors Tr72, Tr74, Tr76, and Tr78 that produce a pair of sequential inverters which generate input signal 108. Bus monitor 127 includes transistors Tr4 and Tr5 in an inverter configuration, as shown.

Voltage divider 129 includes transistors Tr8, Tr9, Tr10, and Tr11 which, when buffer bus 103 is high, produces an output voltage at the source of Tr82 equal to approximately $V_{DD}/2$. This voltage is reflected into the output of inverter 121 (Tr80 and Tr82) which, in conjunction with inverter 119 (Tr6 and Tr7), combines to drive the transistor Tr17 of the high level output driver circuit 131. As discussed above, this output driver circuit 131 feedback path prevents the gate voltage of Tr17 from driving the Tr17 transistor into saturation, and thereby degrading its switching speed. Voltage limiter 123 (Tr12 and Tr13) prevents 5V signals from appearing on the voltage divider 129 when higher voltages are present on buffer bus 103.

As described above, well voltage control circuit 137 monitors the voltage on buffer bus 103 and maintains the back-gate voltage of Tr17 at a level above 3.3V and equal to the voltage on data bus 103 when the voltage of the incoming signal exceeds $V_{DD}$. Well voltage control circuit 137 includes transistors Tr19, Tr20, Tr21, Tr22, and Tr23. When buffer bus 103 goes high, the output of transistor Tr5 goes low and turns off transistor Tr23. The gate of transistor Tr20 is pulled up through the bias level of weakly-biased transistor Tr19, causing transistor Tr20 to shut off. Transistor Tr21, which is also weakly biased at approximately $2V_{DD}/3$ by the voltage divider 133, has its n-well and drain tied together, and with transistor Tr20 shut off, the n-well voltage is pulled up to the voltage on the buffer bus 103. When the voltage on the buffer bus 103 goes low, the output of transistor Tr5 goes high and turns on transistor Tr23. The gate voltage of transistor Tr20 is pulled to ground causing transistor Tr20 to conduct and pull the n-well to $V_{DD}$.

Transistor Tr18 implements driver clamp circuit 135 which serves to keep the gate voltage on the transistor (Tr17) of the output driver circuit 131 at a level equal to the buffer bus 103, when the buffer bus 103 exceeds $V_{DD}$. When enable signal 112 is low (buffer circuit 100 is in the receive mode), the output of transistor Tr6 is driven low, the output of transistor Tr82 is driven high, and transistor Tr17 is shut off. When buffer bus 103 goes high towards $V_{CC}$ (5V) and exceeds $V_{DD}$, the drain voltage exceeds the transistor source voltage of transistor Tr17 causing an inversion of the current flow. To prevent this, transistor Tr18 is inserted at the gate of transistor Tr17 to serve as a pull-up transistor for the gate of transistor Tr17. As the drain voltage on transistor Tr17 rises above $V_{DD}$, transistor Tr18 weakly conducts to allow the gate of transistor Tr17 to track the drain voltage on transistor Tr17 and thereby keep transistor Tr17 shut off.

I claim:

1. A buffer circuit for transmitting digital data between a first system having a lower supply voltage and a second system having a higher supply voltage, the buffer circuit comprising:

enable means having an enable input connected to receive an enable input signal from the first system, a data input connected to receive a data input signal from the first system, and a data output operable is enabled and disabled states by the enable input signal to selectively propagate the data signal as determined by the state of the enable signal, for controlling the transmission of data from the first system to the second system;

driver means having a first input connected to the data output of the enable means, a second input, and a driver output, for propagating the data signal received from the enable means; and feedback means for coupling the driver means output to the driver means second input for maintaining at least a minimum level of charge conduction through said driver means at all times.

2. The buffer circuit of claim 1 further comprising: driver clamp means connected to the driver output and the driver means for preventing voltage levels of the second system from passing into the driver means when transmission from the first system to the second system is disabled by the enable means.

3. The buffer circuit of claim 1 wherein the circuit is implemented in CMOS.

4. The buffer circuit of claim 3 wherein the driver means further comprises a p-channel output transistor constructed over an n-well for providing signal power to the driver means output signal.

5. The buffer circuit of claim 4 further comprising: well voltage control means connected between the driver output and the output transistor n-well for maintaining the n-well back-gate voltage at a level at least equal to the voltage present at the driver output and in no case less than the lower supply voltage of the first system.

6. A buffer circuit for transmitting digital data between a first system having a lower supply voltage and a second system having a higher supply voltage, the buffer circuit comprising:

enable means having an enable input connected to receive an enable input signal from the first system, a data input connected to receive a data input signal from the first system, and a data output operable in enabled and disabled states by the enable input signal to selectively propagate the data signal as determined by the state of the enable signal, for controlling the transmission of data from the first system to the second system;

driver means having a first input connected to the data output of the enable means, a second input, and a driver output, for propagating data received from the enable means;

feedback means for monitoring and propagating the driver means output signal to the driver means second input; and receive means having an input connected to the second system and an output connected to the first system for transmitting digital data from the second system to the first system.

7. The receive means of claim 6 further comprising: voltage limiting means for reducing the voltage level of the received signal to a value no higher than the supply voltage of the first system.

8. A method for transmitting digital data between a first system having a lower supply voltage and a second system having a higher supply voltage using a buffer circuit having a driver, and an output bus connected to the driver, wherein the method comprises the steps of:

receiving at the buffer circuit an enable signal and a data signal from the first system;

in response to said enable signal, transmitting from the driver the data signal received from the first system; and feeding the transmitted data signal back to an input of the driver to maintain at least a minimum level of conduction through said driver at all times.

9. The method of claim 8 further comprising the step of:

clamping the driver to prevent voltage levels from the second system supply from propagating back through the driver.

10. A method for transmitting digital data between a first system having a lower supply voltage and a second system having a higher supply voltage using a buffer circuit having a driver, and an output bus connected to the driver, said driver comprising a p-channel MOS output transistor, wherein the method comprises the steps of:

enabling the buffer circuit in order to transmit the data from the first system to the second system;

receiving data at the driver;

transmitting data from the driver to the second system along the output bus.;

feeding back a signal from the output bus to the input of the driver, maintaining at all times at least a minimum charge conduction through the p-channel transistor for the purpose of improving frequency response; and disabling the buffer circuit when transmission from the first system to the second system is completed.

11. The method of claim 8 wherein the driver comprises a p-channel MOS output transistor constructed over an n-well having a back gate voltage, and wherein the step of transmitting further comprises the step:

maintaining the n-well back gate voltage at a level at least equal to the voltage present at the output bus and in no case less than the lower voltage of the first system.

* * * * *